(12) United States Patent
Katsap

(10) Patent No.: US 11,562,879 B2
(45) Date of Patent: Jan. 24, 2023

(54) LOW-BLUR ELECTROSTATIC TRANSFER LENS FOR MULTI-BEAM ELECTRON GUN

(71) Applicants: NuFlare Technology, Inc., Yokohama (JP); NuFlare Technology America, Inc., Sunnyvale, CA (US)

(72) Inventor: Victor Katsap, Hopewell Junction, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 266 days.

(21) Appl. No.: 17/021,553

(22) Filed: Sep. 15, 2020

(65) Prior Publication Data

US 2022/0084778 A1 Mar. 17, 2022

(51) Int. Cl.
*H01J 37/12* (2006.01)
*H01J 37/30* (2006.01)
(Continued)

(52) U.S. Cl.
CPC .............. *H01J 37/12* (2013.01); *H01J 29/51* (2013.01); *H01J 37/3002* (2013.01); *H01J 37/3177* (2013.01)

(58) Field of Classification Search
CPC ........ H01J 49/06; H01J 49/061; H01J 49/063; H01J 49/22; H01J 49/26; H01J 49/488; H01J 37/12; H01J 37/05; H01J 37/09; H01J 37/305; H01J 37/244; H01J 37/1472; H01J 37/3002; H01J 37/3177; H01J 37/063
See application file for complete search history.

(56) References Cited

U.S. PATENT DOCUMENTS

| 6,617,595 | B1 | 9/2003 | Okunuki | |
|---|---|---|---|---|
| 2012/0223244 | A1* | 9/2012 | Welkie | H01J 49/061 250/396 ML |
| 2018/0211812 | A1* | 7/2018 | Matsui | H01J 37/305 |

FOREIGN PATENT DOCUMENTS

| JP | H01-95456 | 4/1989 |
|---|---|---|
| JP | 2001-118491 A | 4/2001 |
| JP | 2007-103107 | 4/2007 |

OTHER PUBLICATIONS

Office Action dated Sep. 5, 2022, issued in corresponding Taiwanese patent application No. 110124751 (with English translation).

* cited by examiner

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

An electrostatic beam transfer lens for a multi-beam apparatus that includes a series of multiple, successive electrodes, such that an aperture bore of each electrode is aligned along an electron gun axis and is configured to allow multiple beams to pass therethrough. The first electrode in the series is a cylindrical electrode configured to receive the multiple beams at an entrance plane. The first electrode has a bore length and a bore diameter such that a ratio of bore diameter/bore length<0.3. The shape of the first electrode defines the electrostatic field penetration to the entrance plane of the first electrode to prevent lens focusing fields of the electrostatic beam transfer lens from extending through the first electrode and beyond the entrance plane, thus providing a uniform, flat electric field at the entrance area of the electrostatic transfer lens.

16 Claims, 5 Drawing Sheets

(51) Int. Cl.
*H01J 29/51* (2006.01)
*H01J 37/317* (2006.01)

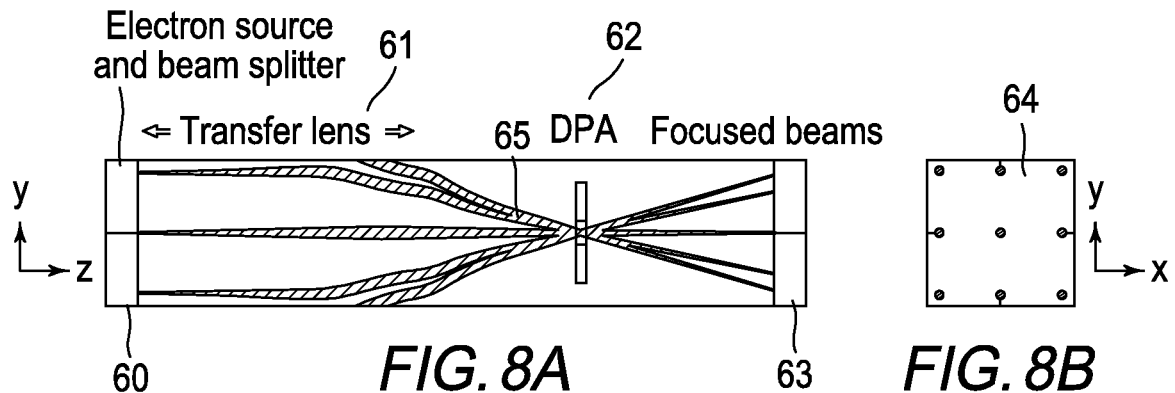
FIG. 8A
FIG. 8B
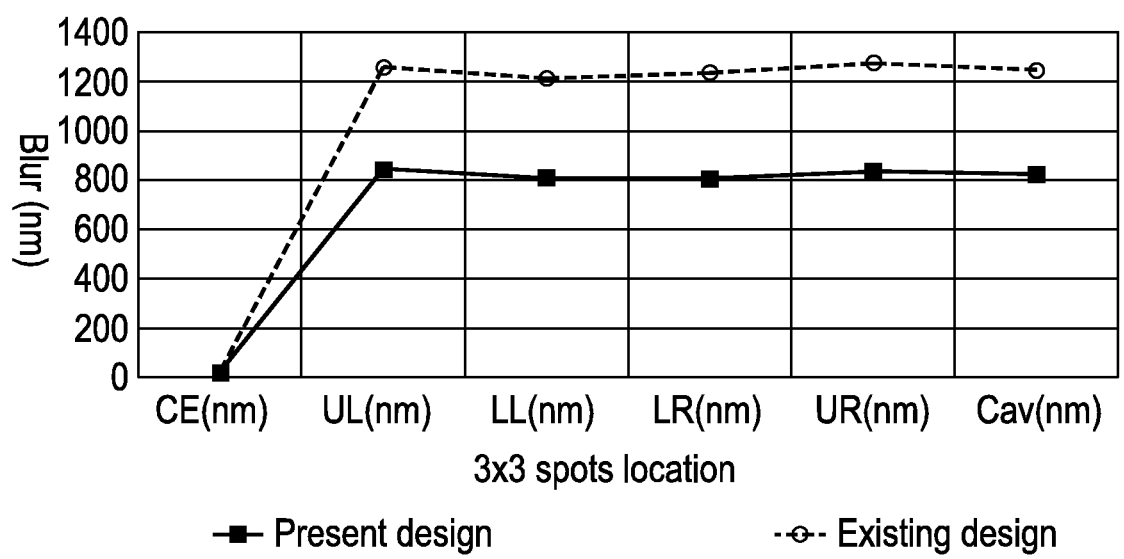
FIG. 9

LOW-BLUR ELECTROSTATIC TRANSFER LENS FOR MULTI-BEAM ELECTRON GUN

TECHNICAL FIELD

This disclosure relates to multi-beam electron guns used in electron beam lithography and inspection, particularly to an electrostatic beam transfer lens in a multi-beam electron lithography and inspection apparatus.

DESCRIPTION OF THE RELATED ART

An electron beam lithography exposure technique is a very important micro patterning technique, which can achieve micro patterning of features on or in a substrate, sizes of the features being in the order of 0.1 μm or less. An electron beam inspection apparatus requires beam size of sub-10 nm.

A conventional electron beam lithography apparatus, as well as a scanning electron microscope (SEM) and inspection systems, utilizes a single-beam scheme, such as a Gaussian beam scheme or a variable shaped beam scheme. For example, the lithography scheme of electron beam lithography is a low-throughput process compared to optical projection lithography schemes, and is typically used in application fields such as mask write, research and development of Ultra Large Scale Integration (ULSI), and Application Specific Integrated Circuit (ASIC) devices, which are produced in small quantities.

Multi-beam SEM and electron beam inspection apparatuses include an electron gun with a high-brightness electron source (e.g., a Schottky-type source), field lens(es), and a beam splitter devised as a plate with plural bores. Each bore permits the passage of some electrons split from the primary electron beam, thus forming multiple beamlets. Each bore operates as single aperture lens. For example, FIG. 1 illustrates the emission of a beam from a Schottky emitter S. The beam passes through a micro-hole array B, which operates as a hole-created micro-lens array. Solid lines shown to the right of hole array B denote electrostatic equipotential lines.

Multi-beam systems provide much higher productivity and throughput than conventional single beam systems.

FIG. 2 shows an example of a conventional multi-lens used in multi-beam lithography or inspection, the lens being comprised of a plurality of electrostatic lenses fabricated using silicon (Si) substrates 11 to 13 as electrodes, and PYREX® glass plates 14 and 15 as insulators. In this example, an electrostatic lens is formed by bonding Si substrates 11 to 13, each having a lens aperture 17, to PYREX® glass plates 14 and 15 by anodic oxidation bonding.

However, an electrostatic lens of this type suffers the following problem. The electrostatic lens shown in FIG. 2 uses glass plates 14, 15 as insulating spacers between the electrodes, the lens being shaped such that the insulating spacers around the lens are directly observable from a beam axis 16 along which an electron beam passes. Since a passing electron beam is readily influenced by charge build-up along the side walls of the insulating spacers (due to electrons and ions being scattered into the lens aperture), the on-axis potential in the electrostatic lens becomes unstable, resulting in beam position drift and deteriorated lens focusing characteristics. Furthermore, when such a multi-lens is formed by decreasing the layout spacing of a plurality of the electrostatic lenses, this results in the production of crosstalk of electric fields due to the close proximity of the electrodes and wiring.

FIG. 3 shows an example of a conventional multi-beam scheme using a single electron beam source 21. In this example, an electron beam 28 is emitted by the single electron beam source 21, collimated by a condenser lens 22, and then split into a plurality of beams by a multi-aperture 23. The plurality of beams pass through a multi-lens 24, which focuses the beams at a predetermined position on a wafer 26, and direct write is attained by use of a stage 27 and deflector 25, which are synchronously scanned.

Existing electron gun designs utilize electrostatic transfer lenses to carry electron beams through the electron gun, out into a column, and onto a target. As shown in FIG. 4, existing electrostatic beam transfer lenses are formed by a series of disc-like electrodes 31-33 having apertures therein. An electron beam 34 emitted from an electron source 35 propagates along a central axis C through a series of apertures 36-38, which shape the electron beam 34 before it arrives at an entrance A of a beam transfer lens composed of the plurality of electrodes 31, 32, 33. Electrostatic fields in these electrodes penetrate through the aperture bores to the areas outside of the lens (e.g., field leakage), creating a non-flat, non-uniform electric field at the lens entrance A, as shown by the field lines 42 depicted in FIG. 5. This causes focusing and energy variations between individual beams (i.e., beamlets) that in turn results in blurring of focused beams/spots.

FIG. 5 illustrates, in a Y-Z plane, one (e.g., the central) of 9 beams arranged in a 3×3 array passing through the entrance A of the transfer lens as the beams travel down the column D. In FIG. 5, solid lines (e.g., 39, 40, 41, 42, 43, 44) denote electrostatic equipotential lines. Dotted lines, e.g., 45, 46, denote beam paths. Item 47, to the left of the beam paths, denotes in simplified form the emitter beam source, condenser lens, and multi aperture before the beam transfer lens. Item 48 denotes an aperture in the front of the beam transfer lens. The beams are then focused at the plane of the transfer lens entrance A, and are subject to Field Curvature (FC) distortion, as depicted by a second-order curved surface 49 crossing the central beam axis C to the left side of the transfer lens entrance area A. The effect of this is that FC distortion is superimposed on the transfer lens entrance area A, which introduces field non-uniformity and exacerbates blurring of the beams as they pass through the column.

The structure of the existing electrostatic transfer lens, in which a plurality of beam focal spots are located on a curved surface upstream from the transfer lens entrance, provides only a worse resolution of the beams in contrast to a design in which the plurality of beam focal spots are not located on a curved surface perpendicular to the central axis of the column. The present disclosure addresses the above problems by describing an electrostatic transfer lens with a particular design of its constituent components that produces uniform, flat, electrostatic fields at the transfer lens entrance area, which reduces blurring of the focused beams/spots at the image plane.

SUMMARY

A multi-beam electron gun design that provides for a uniform, flat, electric field at the entrance area of the electrostatic transfer lens of the electron gun is presented herein. The electrostatic transfer lens includes multiple electrodes in succession, each electrode being a hollow cylinder having a bore through which multiple beamlets pass therethrough.

In one embodiment, the first electrode in the series of multiple electrodes, receiving the multiple beamlets from a high-brightness electron source (e.g., a Schottky-type source), comprises a hollow cylinder having a ratio of bore diameter to bore length that is smaller than 0.3. The shape of the first electrode defines the electrostatic field penetration to the entrance plane of the first electrode to prevent lens focusing fields of the electrostatic beam transfer lens from extending through the first electrode and beyond the entrance plane, thus providing a uniform, flat electric field at the entrance area of the electrostatic transfer lens. The electrostatic transfer lens of the present application reduces the focused beams blur by >30%, resulting in higher resolution in multi-beam electron optical tools.

BRIEF DESCRIPTION OF THE DRAWINGS

The application will be better understood in light of the detailed description, which is given in a non-limiting manner, accompanied by the attached drawings in which:

FIGS. 8A and 8B illustrate other views of the emission of multiple beams through the electrostatic beam transfer lens of the present application, through the differential pumping aperture, and being focused at an image plane.

FIG. 9 shows the resulting reduction in blur of a focused 3×3 array of 9 beams using the electrostatic beam transfer lens of the present application as compared to the existing design of such a lens.

DETAILED DESCRIPTION OF THE PREFERRED EMBODIMENTS

Reference throughout this specification to "one embodiment" or "an embodiment" means that a particular feature, structure, material, or characteristic described in connection with the embodiment is included in at least one embodiment of the application, but does not necessarily denote that it is present in every embodiment.

Thus, the appearances of the phrases "in one embodiment" or "in an embodiment" in various places throughout this disclosure are not necessarily referring to the same embodiment. Furthermore, the particular features, structures, materials, or characteristics may be combined in any suitable manner in one or more embodiments.

Figure 6:
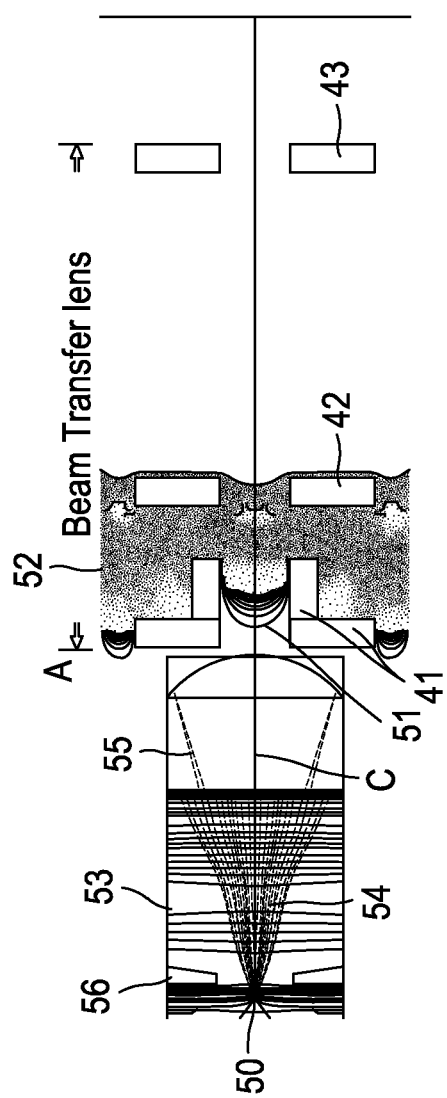
FIG. 6 shows a cross-section of an electrostatic beam transfer lens of the present application.

In one non-limiting embodiment of the present application, the physical structure of an electrostatic multi-beam beam transfer lens is depicted in the cross-section shown in FIG. 6. The electrostatic multi-beam beam transfer lens comprises a series of multiple (e.g., three) hollow cylindrical electrodes 41, 42, and 43. Incoming multiple electron beams are emitted from the high-brightness electron source 50 and pass through a field lens (not shown) and a beam splitter 56 devised as a plate with plural bores (not shown) before reaching an entrance A of the electrostatic beam transfer lens. In FIG. 6, solid lines (e.g., 51, 52, 53) denote electrostatic equipotential lines. Dotted lines, e.g., 54, 55, denote beam paths. Item 56 denotes in simplified form the emitter beam source, condenser lens, and multi aperture before the beam transfer lens.

The three electrodes 41, 42, and 43 may be made from stainless steel (e.g., 316 stainless steel) or a titanium alloy (e.g., titanium-zirconium-molybdenum (TZM)). The first electrode 41 is disposed downstream from the electron source, is preferably made from stainless steel or a TZM alloy and has a hollow cylindrical shape for which a ratio of its bore diameter to its bore length is less than 0.3. The second electrode 42 has a bore through which the electron beams pass as they travel downstream, and the third electrode 43 has a bore through which the electron beams pass as they travel downstream towards the exit pupil.

Whereas the dimensions for the first electrode 41 are strictly specified, as described above, the dimensions of the second and third electrodes 42 and 43 may have wide range of sizes. Generally, the second and third electrodes are also made of stainless steel or a TZM alloy by machining or stamping. The electrodes are joined together to form optics with the help of ceramic insulators (shaped, e.g., as rods and rings). The spacing between the electrodes depends on the intended function of the electron gun and on the desired size and restrictions imposed by the high-voltage power supply that powers the electron gun.

Figure 1:
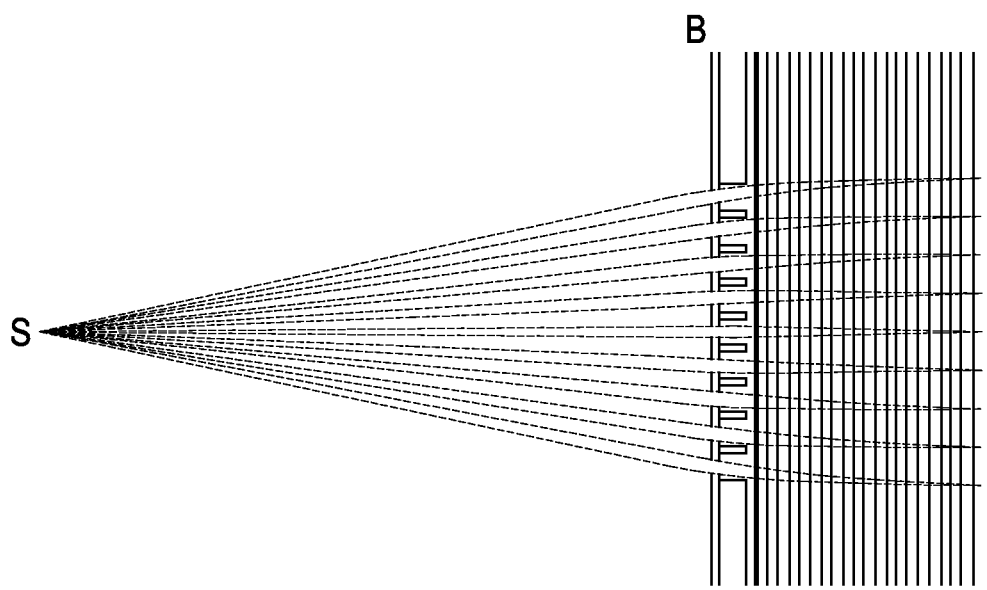
FIG. 1 illustrates the emission of a beam from a Schottky emitter and which passes through a micro-hole array.
Figure 2:
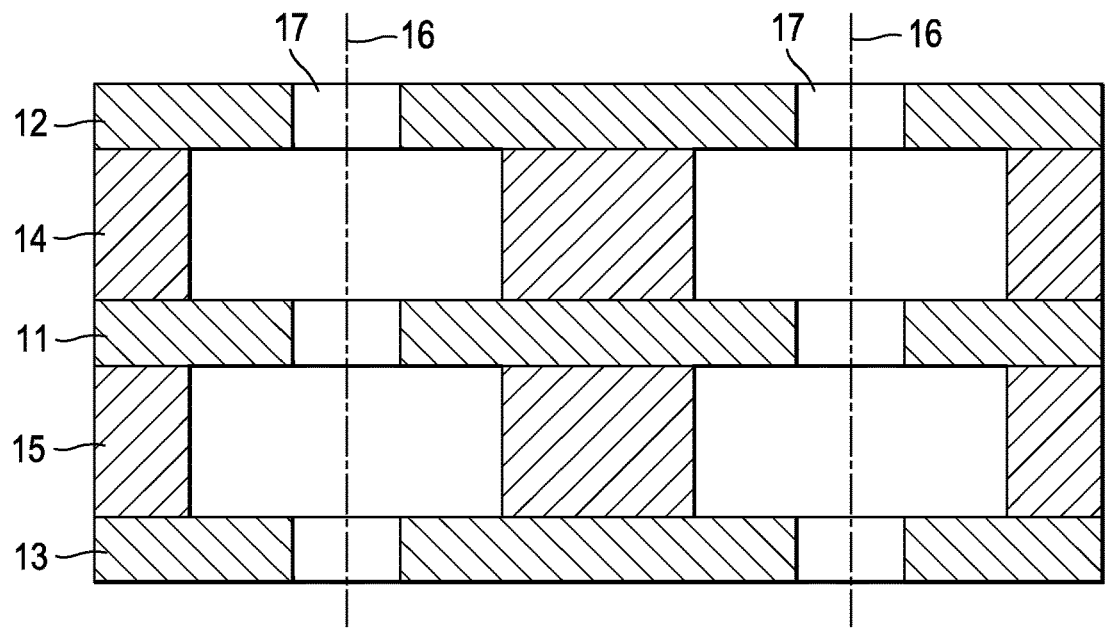
FIG. 2 shows a schematic of a cross-section of a conventional electrostatic multi-lens used in electron beam lithography.
Figure 3:
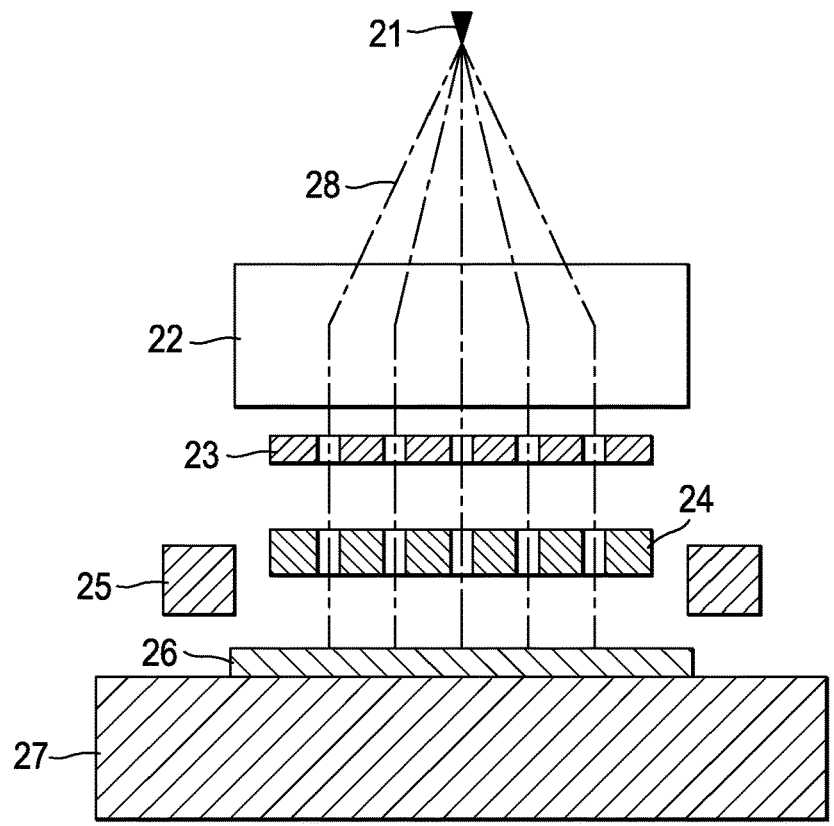
FIG. 3 shows a schematic of a cross-section of a conventional multi-beam scheme using a single electron beam source.
Figure 4:
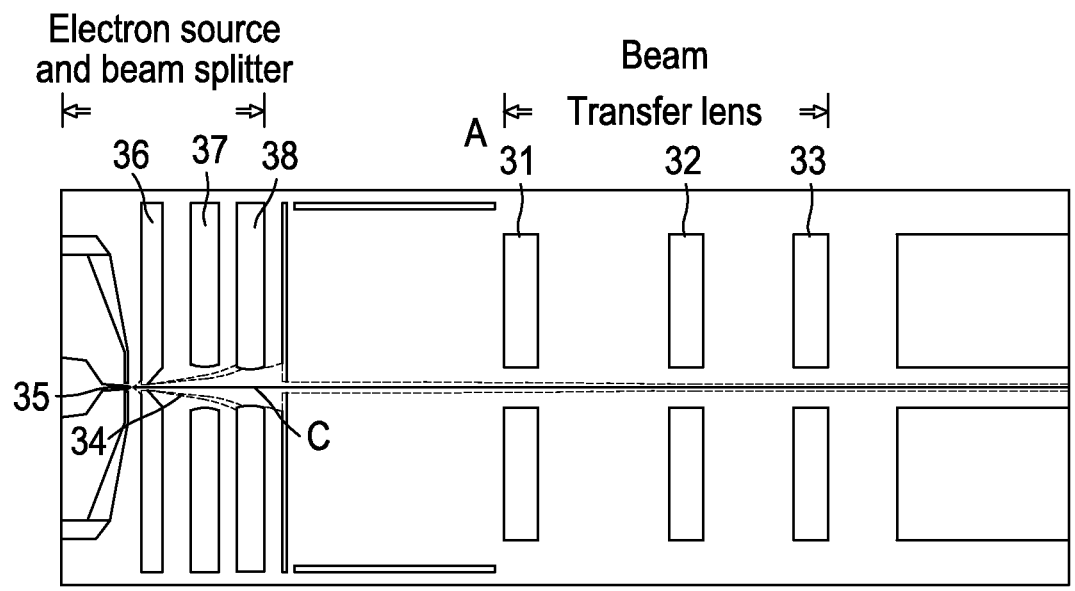
FIG. 4 shows a schematic of a cross-section of a conventional electrostatic beam transfer lens in the interior of a conventional electron gun.
Figure 5:
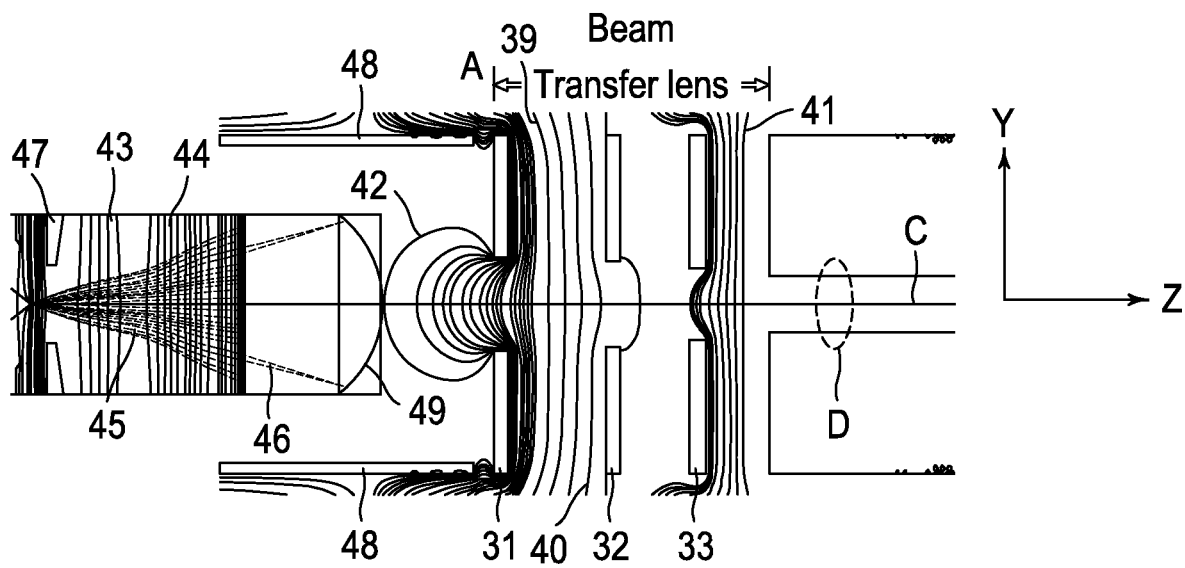
FIG. 5 shows electrostatic field lines present in the interior of an electron gun using a conventional transfer lens.

The first electrode 41 is formed as a so-called "optically thick" cylinder, with a particular design described below, such that it does not allow the lens focusing fields formed by the first, second, and third electrodes 41, 42, 43 to extend through the first electrode 41 beyond the plane defined by entrance A. That is, the design of first electrode 41 prevents field leakage from penetrating to areas outside of the electrostatic beam transfer lens and from penetrating beyond entrance A. This prevents the formation of a non-flat, non-uniform electric field at the transfer lens entrance A, in contrast to what is depicted in FIG. 5.

As shown in FIG. 6, beams are focused by the electric fields between the first electrode 41, second electrode 42, and third electrode 43. Notably, the electrostatic beam transfer lens entrance area A, located upstream of the first electrode 41 is field-free, having the same electrostatic potential throughout. This is accomplished because of the particular shape of the first electrode 41. The shape, or the aspect ratio of the first electrode 41 defines the electrostatic field penetration to the entrance plane of the first electrode 41. The preferred shape of the first electrode 41 is a high-aspect ratio cylinder. A further preferred shape may be a high-aspect ratio cylinder having an oversized entrance aperture, e.g., as shown in FIG. 6.

In order to obtain a uniform electrostatic field at the transfer lens entrance area A, the first electrode 41 is designed such that a ratio of its bore diameter to its bore length is <0.3:

$$\text{bore diameter/bore length} < 0.3 \qquad (1)$$

The electrostatic beam transfer lens with the first electrode 41 having a structure defined by the inequality (1) effectively "shields" the electrostatic beam transfer lens entrance A from the internal electric fields of the lens, thus allowing for a uniform electrostatic potential to be present in at entrance area A.

Figure 7:
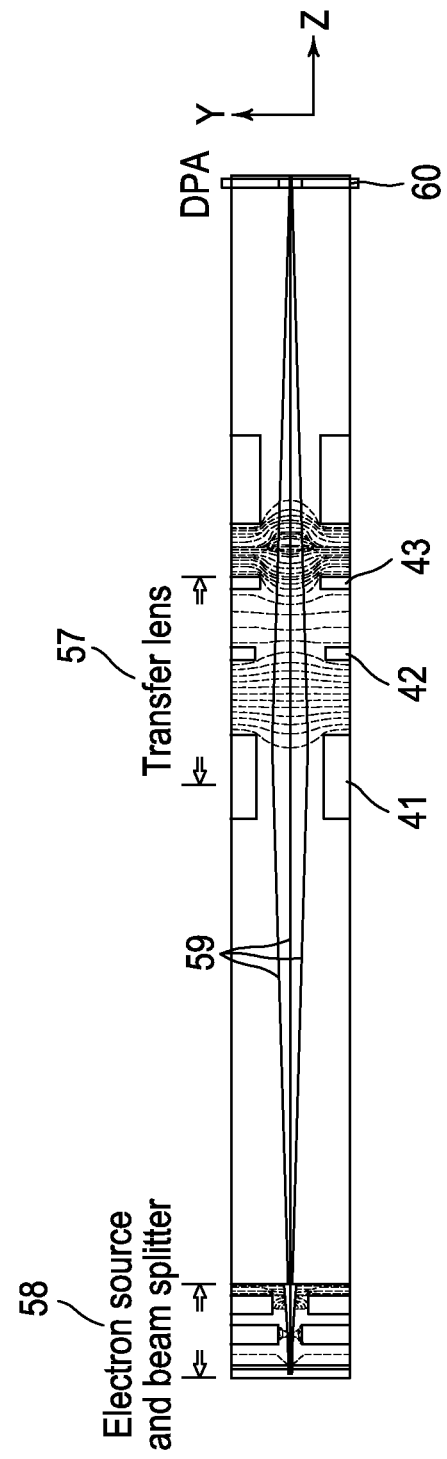
FIG. 7 illustrates one view of the emission of multiple beams through the electrostatic beam transfer lens of the present application and toward a differential pumping aperture.

The paths 59 of three of 9 incident beams arranged in a 3×3 array is outlined in FIG. 7, in a Y-Z plane. The dotted lines denote electrostatic equipotential lines. The transfer lens 57 comprising electrodes 41, 42, 43 accepts multiple beams e.g., 59, from the electron source/condenser lens/ multi aperture 58 and focuses them into a single spot at the gun exit pupil 60, or Differential Pumping Aperture (DPA).

FIG. 8A depicts, in the Y-Z plane, a simplified view of the entire electron gun design that shows schematically the propagation of the electron beams 65 along the succession of the various components including the electron source/condenser lens/multi aperture 60, and the electrostatic beam transfer lens 61. The transfer lens 61 receives electron beams from the electron source and beam splitter 60 and the electron beams 65 are then propagated towards the exit pupil DPA 62 and onto the lens image plane 63. FIG. 8B shows, the X-Y plane, a 3×3 array of focused beams 64 at the lens image plane 63 of FIG. 8A.

FIG. 9 is a graph depicting the resulting reduction in blur of a focused 3×3 array of 9 beams using the electrostatic beam transfer lens of the present disclosure as compared to the existing design of such a lens. In FIG. 9, CE, UL, LL, LR, UR, and Cav along the abscissa denote Center Spot, Upper-Left Spot, Lower-Left Spot, Lower-Right Spot, Upper-Right Spot, and Blur Average, respectively, all units of which are nanometers. The measure of blur in nanometers is shown on the ordinate, and values of blur are plotted for each of CE, UL, LL, LR, UR, and Cav for both the existing design of an electrostatic beam transfer lens and the electrostatic beam transfer lens according to the present disclosure. As shown in FIG. 9, the blur at the Center Spot is about 1 nm. As shown in FIG. 9, the electrostatic beam transfer lens of the present disclosure achieves a reduction of blur in the focused beams for each of UL, LL, LR, UR, and Cav by >30% compared to a known electrostatic transfer lens. As also shown in FIG. 9, the blur at the Center Spot is about 1 nm for both the existing design and for the electrostatic beam transfer lens according to the present disclosure, whereas the off-center blur for UL, LL, LR, UR, and Cav is greater than about 1,200 nm for the existing design but only about 800 nm for the electrostatic beam transfer lens according to the present disclosure.

The advantage of using the electrostatic beam transfer lens according to the present disclosure in an electron gun instead of an existing electrostatic beam transfer lens is realized in terms of reduced blur in the focused beams, which results in the ability to achieve a higher resolution in multi-beam electron optical tools, such as scanning electron microscopes and electron beam lithography.

Numerous modifications and variations of the present disclosure are possible in light of the above description. It is therefore to be understood that within the scope of the appended claims, the disclosure may be practiced otherwise than as specifically described.

What is claimed is:

1. An electrostatic beam transfer lens for a multi-beam apparatus, the electrostatic beam transfer lens comprising:
    a series of multiple, successive electrodes, each electrode being spaced apart from each other, the electrodes being disposed along an electron gun axis such that an aperture bore of said each electrode is aligned along a central axis and is configured to allow multiple beams to pass therethrough,
    a first electrode in the series being a cylindrical electrode configured to receive the multiple beams at an entrance plane that is perpendicular to the central axis and upstream of the successive electrodes of the series along a column, and to prevent lens focusing fields of the electrostatic beam transfer lens from extending through the first electrode and beyond the entrance plane,
    wherein the first electrode has a bore length and a bore diameter such that a ratio of bore diameter/bore length<0.3.

2. The electrostatic beam transfer lens according to claim 1, wherein the series of multiple, successive, electrodes includes three electrodes.

3. The electrostatic beam transfer lens according to claim 1, wherein the transfer lens is configured to focus the multiple beams into a single spot at an image plane.

4. The electrostatic beam transfer lens according to claim 1, wherein said each electrode in the series of multiple, successive, electrodes comprises stainless steel or a titanium alloy.

5. The electrostatic beam transfer lens according to claim 4, wherein the titanium alloy is titanium-zirconium-molybdenum.

6. The electrostatic beam transfer lens according to claim 1, wherein the electrodes in the series are joined together via ceramic insulators.

7. The electrostatic beam transfer lens according to claim 6, wherein the ceramic insulators are shaped as rods and rings.

8. A multi-beam field emission gun (FEG) for a multi-beam apparatus, the FEG comprising:
    an electron source;
    a micro-hole array beam splitter disposed downstream of the electron source, being configured to receive a beam from the electron source and to produce multiple beams;
    an electrostatic beam transfer lens comprising a series of multiple, successive, electrodes, each electrode being spaced apart from each other, the electrodes being disposed along a column such that an aperture bore of said each electrode is aligned along a central axis and is configured to allow multiple beams to pass therethrough;
    a first electrode in the series being a cylindrical electrode configured to receive the multiple beams from the beam splitter at an entrance plane that is perpendicular to the central axis and upstream of the successive electrodes of the series along the column, and to prevent lens focusing fields of the electrostatic beam transfer lens from extending through the first electrode and beyond the entrance plane,
    wherein the first electrode has a bore length and a bore diameter such that a ratio of bore diameter/bore length<0.3; and
    a differential pumping aperture configured to receive a focused beam from the electrostatic beam transfer lens, and to produce an array of focused beams at an image plane.

9. The FEG according to claim 8, wherein the series of multiple, successive, electrodes includes three electrodes.

10. The FEG according to claim 8, wherein the electron source is a Schottky source.

11. The FEG according to claim 8, wherein the micro-hole array beam splitter comprises a micro lens array.

12. The FEG according to claim 8, wherein the transfer lens is configured to focus the multiple beams into a single spot at the image plane.

13. The FEG according to claim 8, wherein said each electrode in the series of multiple, successive, electrodes comprises stainless steel or a titanium alloy.

14. The FEG according to claim 13, wherein the titanium alloy is titanium-zirconium-molybdenum.

15. The FEG according to claim 8, wherein the electrodes in the series are joined together via ceramic insulators.

16. The FEG according to claim 15, wherein the ceramic insulators are shaped as rods and rings.

\* \* \* \* \*